United States Patent
Shih

(10) Patent No.: US 10,529,586 B2
(45) Date of Patent: Jan. 7, 2020

(54) METHOD OF MANUFACTURING SEMICONDUCTOR DEVICE

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 15/989,194

(22) Filed: May 25, 2018

(65) Prior Publication Data

US 2019/0362985 A1    Nov. 28, 2019

(51) Int. Cl.
*H01L 21/311* (2006.01)
*H01L 21/033* (2006.01)

(52) U.S. Cl.
CPC .... *H01L 21/31144* (2013.01); *H01L 21/0337* (2013.01)

(58) Field of Classification Search
None
See application file for complete search history.

(56) References Cited

U.S. PATENT DOCUMENTS 9,941,164 B1* 4/2018 Kim ............... H01L 21/76897

FOREIGN PATENT DOCUMENTS

TW    201303962 A1    1/2013

* cited by examiner

*Primary Examiner* — Asok K Sarkar
(74) *Attorney, Agent, or Firm* — CKC & Partners Co., LLC

(57) ABSTRACT

A method of manufacturing semiconductor device is provided in the present disclosure. The method includes forming a first pattern layer on a first area of a substrate, forming a spin on layer on the first pattern layer and the substrate, forming an etch stop layer on the spin on layer, and forming a first mask layer on the etch stop layer.

9 Claims, 7 Drawing Sheets

METHOD OF MANUFACTURING SEMICONDUCTOR DEVICE

BACKGROUND

Field of Invention

The present invention relates to a method of manufacturing a semiconductor device.

Description of Related Art

In general, layers of a semiconductor device are patterned to achieve particular functions. The patterning process is commonly processed by a lithography process, an etching process, etc. When an etching process is implemented, the type of the etchant, the dosage of the etchant, and the time of the etching needs to be controlled properly, so as to generate a desired quality of the etching profile and fineness of the pattern.

However, in some products, when two layers are close in physical and chemical properties, it is difficult to improve the etching profile and the fineness of the pattern by simply changing the type or the dosage of the etchant or the time of the etching.

SUMMARY

The invention provides a semiconductor device manufacturing method. The method includes forming a first pattern layer in a first area of a substrate; forming a spin-on material layer on the first pattern layer and the substrate; forming an etch stop layer on the spin-on material layer; and forming a first mask layer on the etch stop layer.

In some embodiments, the method further includes forming a second mask layer on the first mask layer; forming a photo-resistant layer on the second mask layer; patterning the photo-resistant layer to form a patterned photo-resistant layer; using the patterned photo-resistant layer to etch the first mask layer and the second mask layer to make the first mask layer and the second mask layer form as a patterned mask layer together; and using the patterned mask layer to etch the etch stop layer, the spin-on material layer, and the first pattern layer.

In some embodiments, the second mask layer is made of a material selected from SiON, SiN, Si, or SiO.

In some embodiments, the semiconductor device manufacturing method further includes forming a second pattern layer in a second area on the substrate; and forming the spin-on material layer on the second pattern layer.

In some embodiments, there is a gap between the spin-on material layer on the first pattern layer and the spin-on material layer on the second pattern layer.

In some embodiments, the first pattern layer is made of a material including dielectric or metal.

In some embodiments, the spin-on material is made of a material including organic polymer.

In some embodiments, the etch stop layer is made of a material including SiO, SiON, or Si.

In some embodiments, the first mask layer is made of a material including C.

In some embodiments, the etch stop layer is harder than the first pattern layer and the spin-on material layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
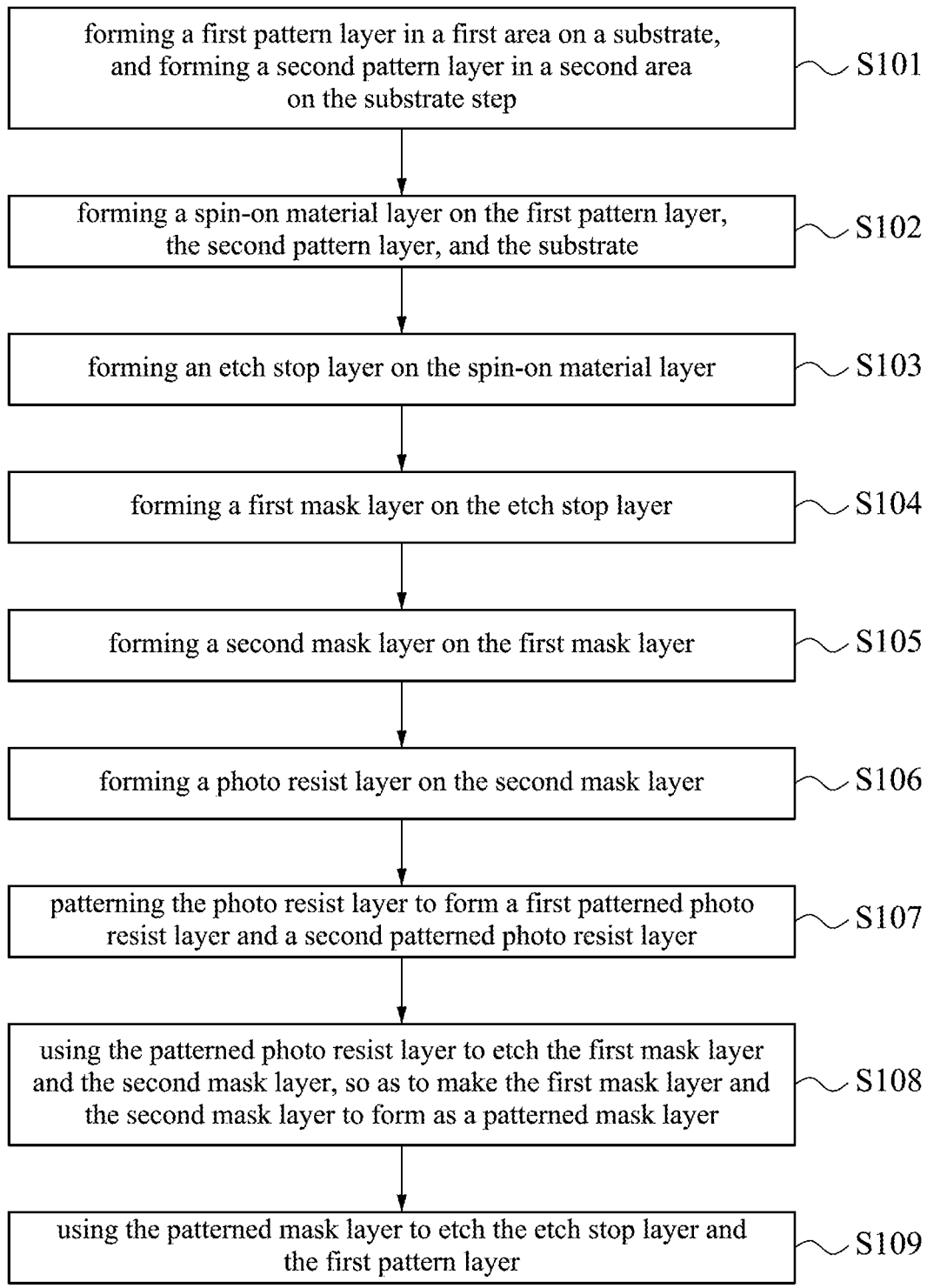
FIG. 1 illustrates a flow diagram of the semiconductor manufacturing method according to an embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

The present disclosure provides a semiconductor manufacturing method, which improves the etching profile and fineness of pattern of a semiconductor device, and further reduces critical dimension of the semiconductor device.

Figure 2A:
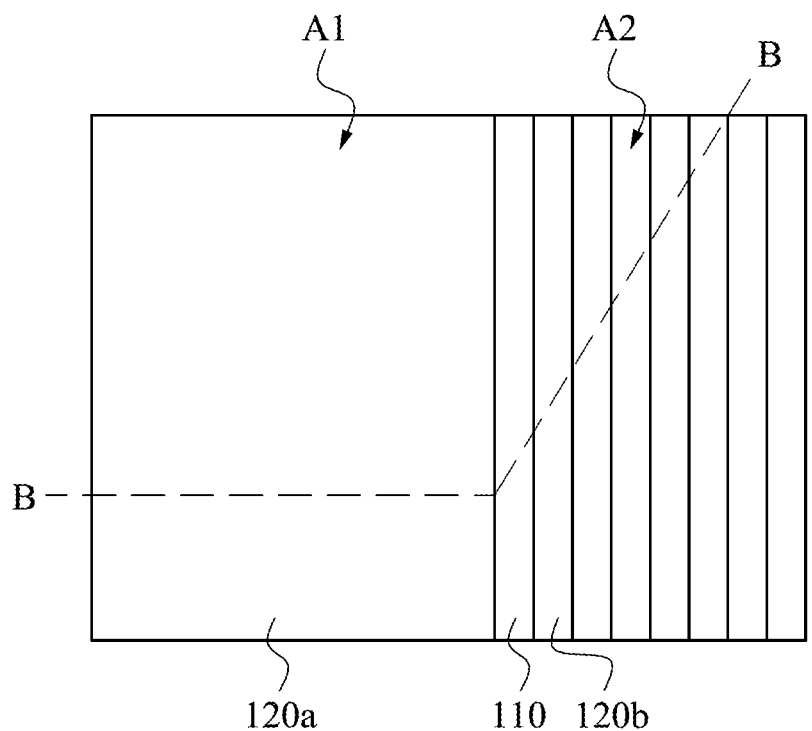
FIG. 2A to FIG. 7A illustrates a top view of a semiconductor device in various steps of the semiconductor manufacturing method; and FIG. 2B to FIG. 7B illustrates cross-sectional views of the semiconductor device in FIG. 2A to FIG. 7A along line B-B.
Figure 2B:
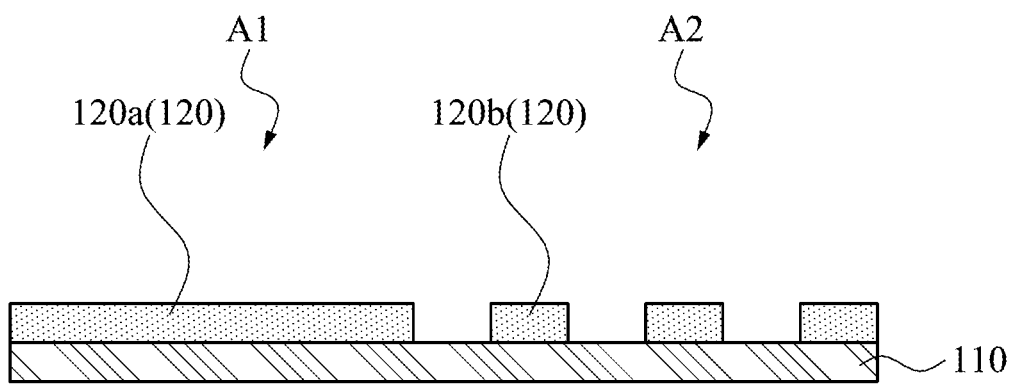

Please refer to FIG. 1, FIGS. 2A-7A, and FIGS. 2B-7B. FIG. 1 illustrates a flow diagram of the semiconductor manufacturing method 100 according to an embodiment of the present disclosure. FIG. 2A to FIG. 7A illustrates a top view of a semiconductor device in various steps of the semiconductor manufacturing method 100. FIG. 2B to FIG. 7B illustrates cross-sectional views of the semiconductor device in FIG. 2A to FIG. 7A along line B-B (specifically, FIG. 2B illustrates the cross-sectional view of the semiconductor device in FIG. 2A along the line B-B, FIG. 3B illustrates the cross-sectional view of the semiconductor device in FIG. 3A along the line B-B, and other FIGs are arranged in the same manner).

Figure 3A:
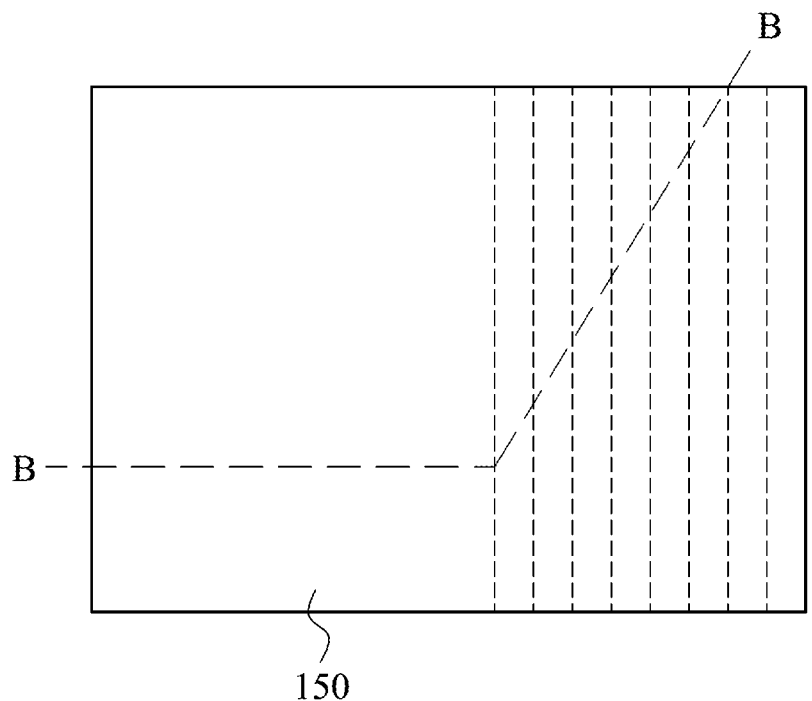
Figure 3B:
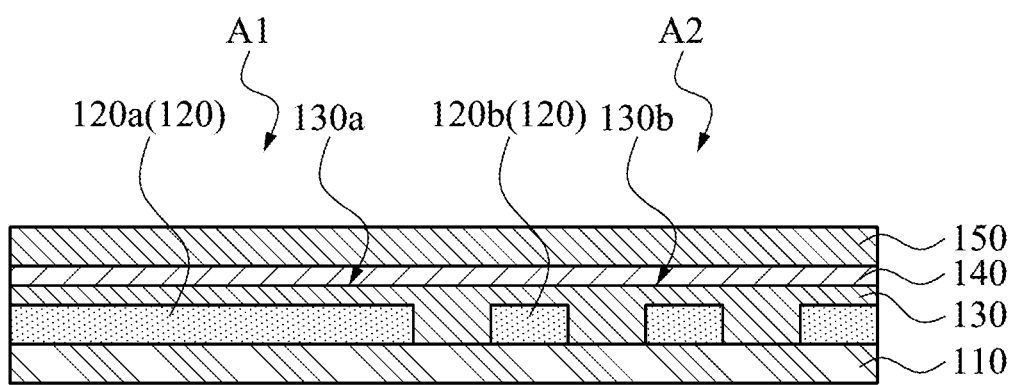

As shown in FIG. 1, the semiconductor manufacturing method 100 includes step S101 to step S109. Please refer to FIG. 2A and FIG. 2B, the semiconductor manufacturing method 100 begins from step S101: forming a first pattern layer 120a in a first area A1 on a substrate 110, and forming a second pattern layer 120b in a second area A2 on the substrate 110. Then as shown in FIG. 3A and FIG. 3B, following with step S102 to step S105. In step S102, forming a spin-on material layer 130 on the first pattern layer 120a, the second pattern layer 120b, and the substrate 110. In step S103, forming an etch stop layer 140 on the spin-on material layer 130. In step S104, forming a first mask layer 150 on the etch stop layer 140.

Figure 4A:
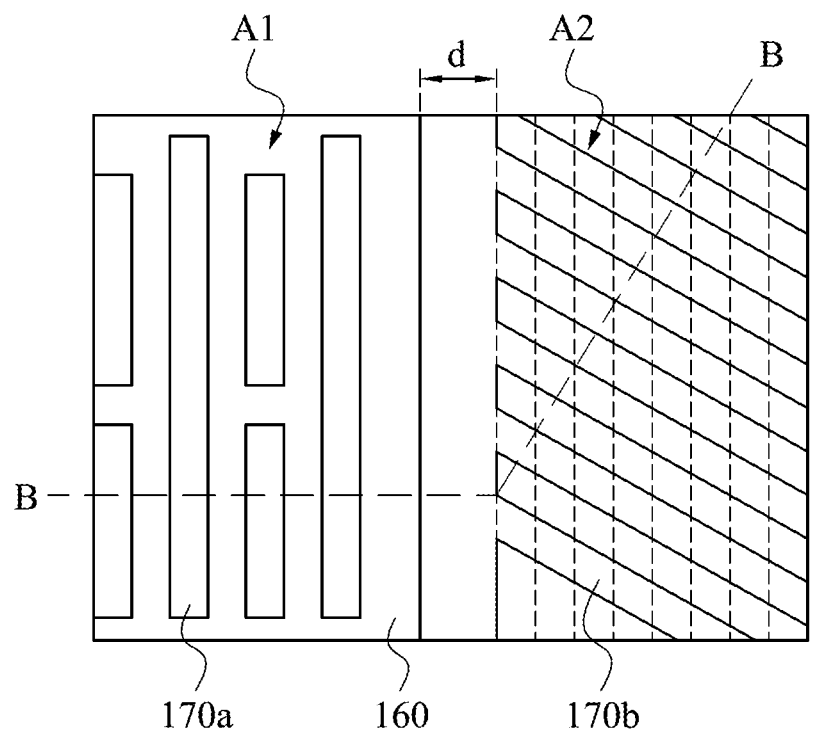
Figure 4B:
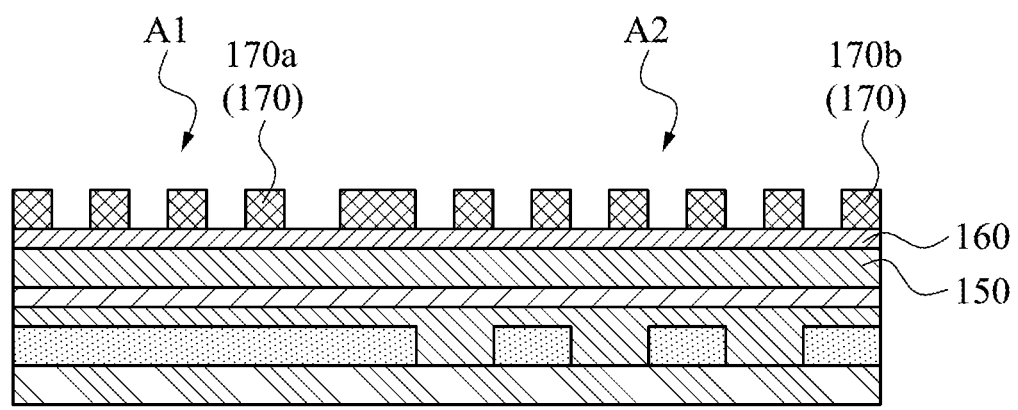
Figure 5A:
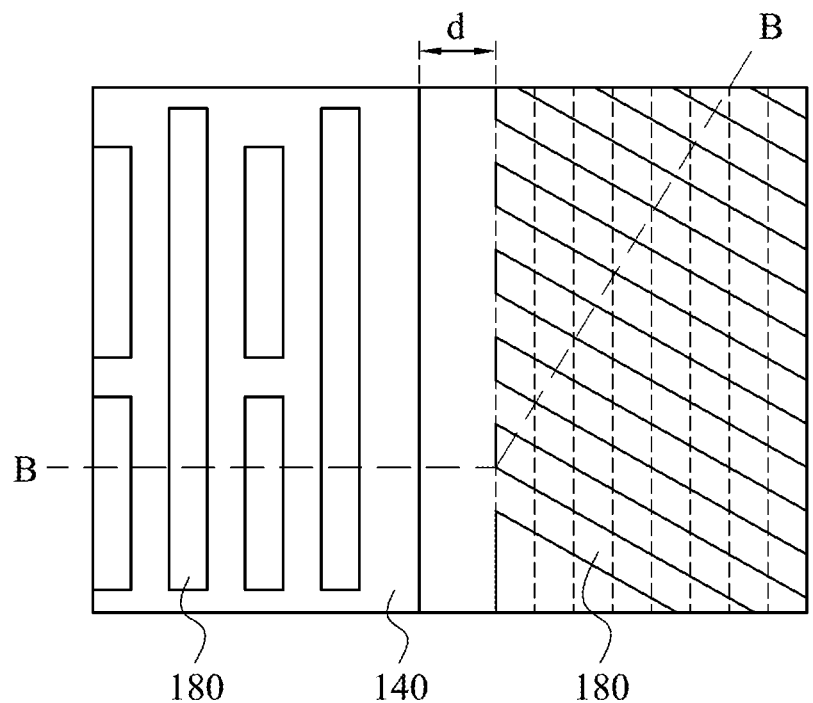
Figure 5B:
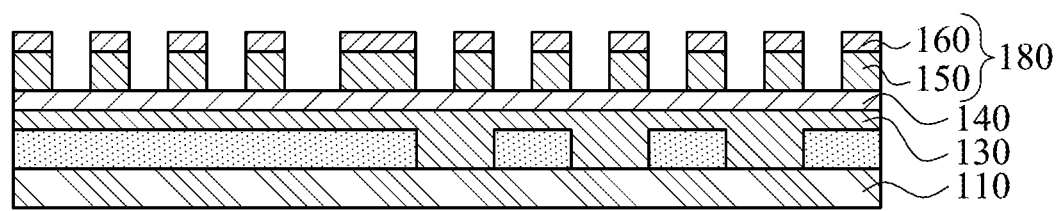

As shown in FIG. 4A and FIG. 4B, the semiconductor manufacturing method 100 is following with step S105 to step S107. In step S105, forming a second mask layer 160 on the first mask layer 150. In step S106, forming a photo-resistant layer 170 on the second mask layer 160. In step S107, patterning the photo-resistant layer 170 to form a first patterned photo-resistant layer 170a and a second patterned photo-resistant layer 170b. Then as shown in FIG. 5A and FIG. 5B, following with step S108. In step S108, using the first patterned photo-resistant layer 170a and the second patterned photo-resistant layer 170b shown in FIG. 4B to etch the first mask layer 150 and the second mask layer 160, so as to make the first mask layer 150 and the second mask layer 160 to form as a patterned mask layer 180. Then as shown in FIG. 6A, FIG. 6B, FIG. 7A, and FIG. 7B, following with step S109. In step S109, using the patterned mask layer 180 to etch the etch stop layer 140, the spin-on material layer 130, the first pattern layer 120a, and the second pattern layer 120b.

Technical details relative to steps S101 to steps S109 are described with figures as following paragraph. It should be understood that some steps may be omitted, and the order of steps are changeable. Additional steps may be added to achieve particular practical needs.

As shown in FIG. 2A and FIG. 2B, in step S101, a first pattern layer 120a is formed in first area A1 on the substrate 110, and a second pattern layer 120b is formed in second area A2 on the substrate 110. Substrate 110 may be a substrate including silicon, or other devices' surface for processing the semiconductor manufacturing method 100. Then a pattern layer 120 is formed on the substrate 110. The pattern layer 120 may be formed of dielectric or metal. The pattern layer 120 may be formed on the substrate 110 by deposition process, epitaxy process, or any other suitable methods. Then pattern the pattern layer 120 in the first area A1 on the substrate 110 to form a first pattern layer 120a, and pattern the pattern layer 120 in the second area A2 on the substrate 110 to form a second pattern layer 120b. The first area A1 of the substrate 110 and the second area A2 of the substrate 110 may be patterned in a same process or difference processes.

In the present embodiment, there is a gap d between the first area A1 and the second area A2 (please refer to FIG. 4A), and thus the first area A1 and the second area A2 are not connected with each other. As such, the design in the first area A1 will not interfere with the design in the second area A2, and thus the designer may design different pattern in the first area A1 and the second area A2. In the present embodiment, the first pattern layer 120a is designed without patterns and the second pattern layer 120b is designed with line stripe pattern. People with ordinary skill in the art may dispose various pattern layers in different areas according to practical needs of the semiconductor device. For example, in some embodiments, a third pattern layer may be disposed in a third area, which is an area that does not overlapped with the first area A1 and the second area A2 on the substrate 110.

As shown in FIG. 3A and FIG. 3B, processing with steps S102 and steps S105. In step S102, a spin-on material layer 130 is formed on the first pattern layer 120a, the second pattern layer 120b, and the substrate 110. The spin-on material layer 130 may be formed by organic polymers. The spin-on material layer 130 may be formed on the substrate 110, the first pattern layer 120a, and the second pattern layer 120b by spin-coating method.

Since the spin-coating materials are flowable materials, the spin-coating material will be filled in the patterns of the first pattern layer 120a and the second pattern layer 120b, and then a first surface 130a is formed on a side of the first pattern layer 120a opposite to the substrate 110, and a second surface 130b is formed on a side of the second pattern layer 120b opposite to the substrate 110. After the spin-coating process, the first surface 130a and the second surface 130b is formed with a quality flatness, and thus layer structures formed afterwards are also promised with a desired flatness. In other words, a planarization process may be omitted in some embodiments.

In the embodiment shown in FIG. 3B, the first surface 130a is substantially coplanar with the second surface 130b. In some embodiments, the first surface 130a is not coplanar with the second surface 130b, and there is a step between the first surface 130a and the second surface 130b. As long as it is smooth in the first area A1 and smooth in the second area A2, the layers forming method and the etching method thereafter may be preceded successfully. By designing the step located in the gap d (please refer to FIG. 4A) between the first area A1 and the second area A2, the defects likely to be generated near the step in the layers forming method and the etching method thereafter will be confined in the gap d, effectively protecting the pattern in the first area A1 and the second area A2.

As shown in FIG. 3A and FIG. 3B, in step S103, form a etch stop layer 140 on the spin-on material layer. Specifically, the etch stop material used for the etch stop layer 140 may include silicon oxide, silicon nitride, or silicon. The etch stop material may be deposited on the spin-on material layer 130 by a deposition process. Since the material of the etch stop layer 140 is different from the material of the spin-on material layer 130, the etch stop layer 140 and the spin-on material layer 130 may be selectively removed by using different etchant and using different dosage of the etchant.

As shown in FIG. 3A and FIG. 3B, in step S104, form a first mask layer 150 on the etch stop layer 140. Specifically, the first mask material used for the first mask layer 150 may include carbon. The first mask material may be deposited on the etch stop layer 140 by a deposition process. Since the material of the first mask layer 150 is different from the material of the etch stop layer 140, the first mask layer 150 and the etch stop layer 140 may be selectively removed by using different etchant and using different dosage of the etchant.

In general, the material of the spin-on material layer 130 and the material of the first mask layer 150 are close in physical and chemical property, so if the first mask layer 150 is disposed on the spin-on material layer 130, it is difficult to selectively remove the spin-on material layer 130 or the first mask layer 150, which would further result in an unsatisfying etching profile and fineness of structure. By adding an etch stop layer 140 between the spin-on material layer 130 and the first mask layer 150, it is possible to selectively remove the spin-on material layer 130 and the first mask layer 150, which would further result in a better etching profile and a better critical dimension. Specifically, the hardness of the etch stop layer 140 is larger than the hardness of the spin-on material layer 130 and the first mask layer 150, so as to make each layer to be selected more accurately.

Please refer to FIG. 4A and FIG. 4B, process step S105 to step S107. In step S105, the second mask layer 160 is formed on the first mask layer 150. Specifically, the second mask material used for the second mask layer 160 may include silicon nitride, silicon oxynitride, silicon, or silicon oxide, so that the second mask layer has a better light absorbing ability with respect to the first mask layer. Specifically, the second mask material may be deposited on the first mask layer 150 by a deposition process.

As shown in FIG. 4A and FIG. 4B, in step S106, form a photo-resistant layer 170 on the second mask layer 160. Specifically, various photo-resistant materials may be used to form the photo-resistant layer 170 by deposition process, spin-on process, and any other suitable process.

As shown in FIG. 4A and FIG. 4B, in step S107, pattern the photo-resistant layer 170 to form a first patterned photo-resistant layer 170a and a second patterned photo-resistant layer 170b. For example, the photo-resistant layer 170 may be patterned by a lithography process. Since the second mask layer 160 is made of materials with better light absorbing ability, thus prevent the light of the lithography process from being reflected by the first mask layer 150. Specifically, the photo-resistant layer 170 in the first area A1 is patterned into a first patterned photo-resistant layer 170a, and the photo-resistant layer 170 in the second area A2 is patterned into a second patterned photo-resistant layer 170b. The photo-resistant layer 170 in the first area A1 and the second area A2 may be patterned in a same process or different processes.

As mentioned above, the first area A1 and the second area A2 are not directly connected with each other, instead, a gap d is located between the first area A1 and the second area A2. So the pattern designed for the first patterned photo-resistant layer 170a may be different from the pattern designed for the second patterned photo-resistant layer 170b. As shown in FIG. 4A, in the present embodiment, the first patterned photo-resistant layer 170a is designed with vertical stripes pattern, and the second patterned photo-resistant layer 170b is designed with tilted stripes pattern. People of ordinary skill in the art may design various patterns of the photo-resistant in different areas according to practical needs.

As shown in FIG. 5A and FIG. 5B, in step S108, use the first patterned photo-resistant layer 170a and the second patterned photo-resistant layer 170b to etch the first mask layer 150 and the second mask layer 160 to make the first mask layer 150 and the second mask layer 160 to form a patterned mask layer 180 together. Various etchants may be used to etch the first mask layer 150 and the second mask layer 160. Since there is an etch stop layer 140 set between the first mask layer 150 and the spin-on material layer 130, when the first mask layer 150 is etched by the etchant, the etch stop layer 140 and the spin-on material layer would not be etched through in the same process.

Since the etchant is stopped by the etch stop layer 140, the etchant would etch sides of the patterned mask layer 180, which is called an over etching effect. The side etching achieves better fineness of the pattern of the patterned mask layer 180.

As shown in FIG. 6A, FIG. 6B, FIG. 7A, and FIG. 7B, in step S109, use the patterned mask layer 180 to etch the etch stop layer 140, the spin-on material layer 130, the first patterned layer 120a, and the second patterned layer 1230b. Specifically, various etchants may be used to etch the etch stop layer 140, the spin-on material layer 130, the first patterned layer 120a, and the second patterned layer 120b.

Figure 6A:
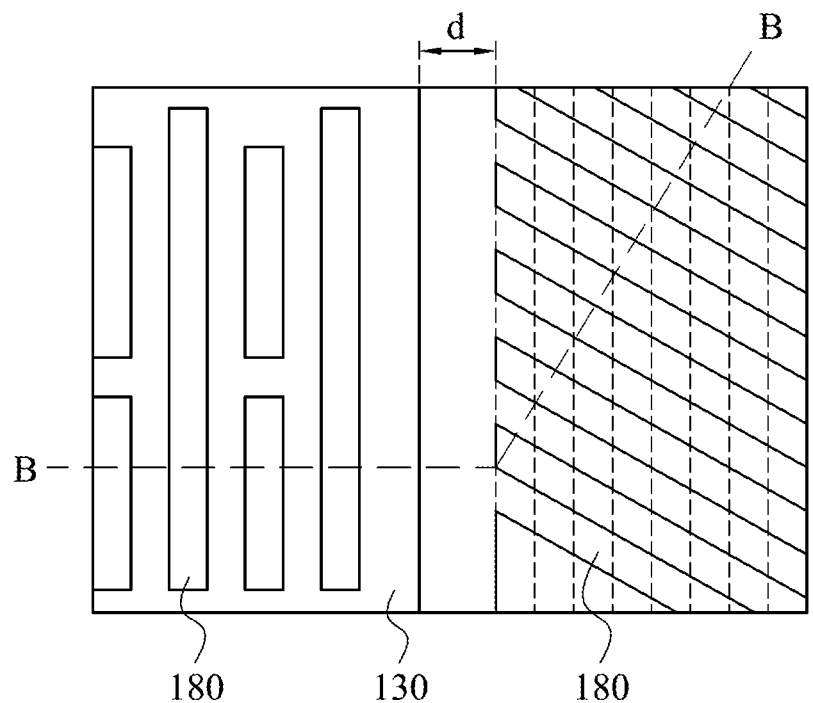
Figure 6B:
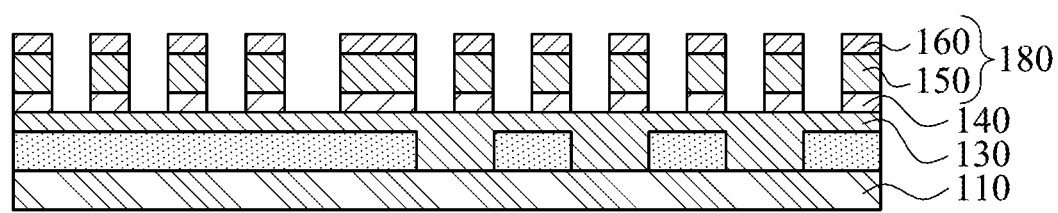

As shown in FIG. 6B, in an early stage of the etching process, the patterned mask layer 180 is used as an etching mask to etch the etch stop layer 140. In the stage, the etch stop layer 140 is patterned.

Figure 7A:
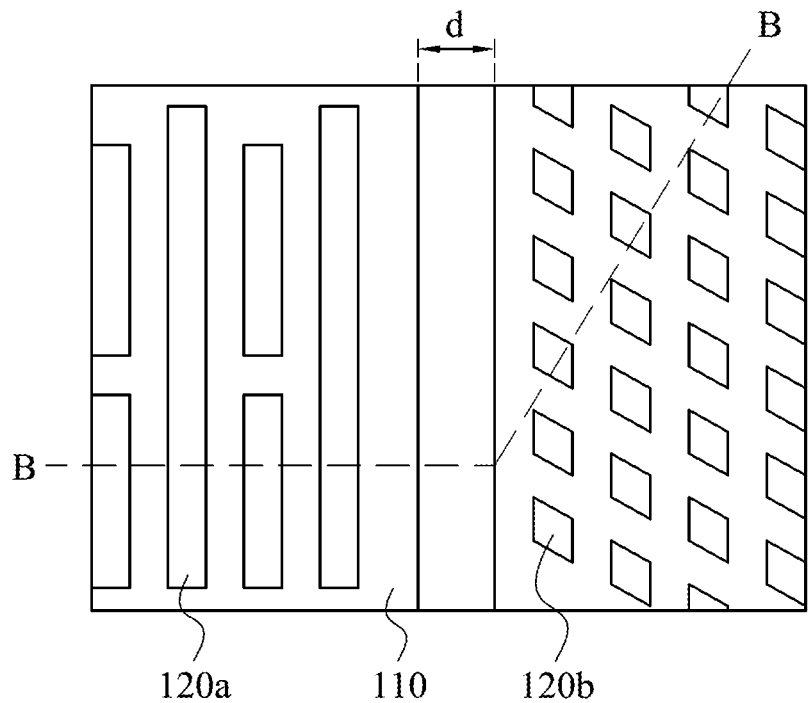
Figure 7B:
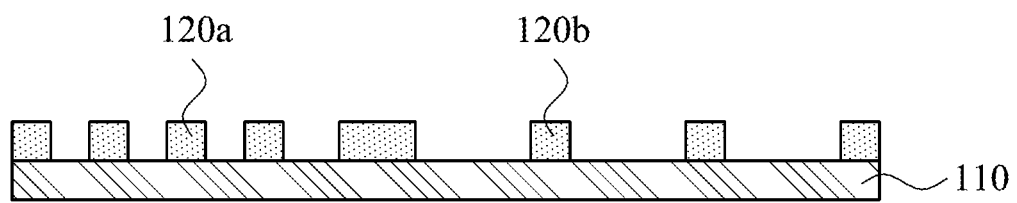

As shown in FIG. 7B, in a later stage of the etching process, the first patterned layer 120a and the second patterned layer 120b located under the patterned mask layer 180 is patterned. When the first patterned layer 120a and the second patterned layer 120b are patterned, the patterned mask layer 180, the etch stop layer 140, and the spin-on material layer 130 (please refer to FIG. 6B) are also removed gradually. After the first patterned layer 120a and the second patterned layer 120b are patterned, most of the spin-on material layer 130, the etch stop layer 140, and the patterned mask layer 180 are removed (and thus are not illustrated in FIG. 7A and FIG. 7B). In some embodiments, additional process may be implemented to remove residue of the spin-on material layer 130, the etch stop layer 140, and the patterned mask layer 180.

It should be realized that, same or different etchants may be used in the early stage or later stage of the etching process, and the dosage of the etchant may be same or different. Additional process may be implemented during the process according to practical needs.

In sum, the semiconductor device manufacturing method of the present disclosure, by use of an etch stop layer, the spin-on material layer and the first mask layer may be etched in different stages of the etching process. During the etching process, sides of the patterned mask layer may be adjusted by the etch stop layer, and thus the fineness and etching profile of the pattern on the semiconductor device may be improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor device manufacturing method, comprising:
   forming a first pattern layer in a first area of a substrate;
   forming a spin-on material layer on the first pattern layer and the substrate;
   forming an etch stop layer on the spin-on material layer;
   forming a first mask layer on the etch stop layer;
   forming a second mask layer on the first mask layer;
   forming a photo-resistant layer on the second mask layer;
   patterning the photo-resistant layer to form a patterned photo-resistant layer;
   using the patterned photo-resistant layer to etch the first mask layer and the second mask layer to make the first mask layer and the second mask layer form as a patterned mask layer together; and
   using the patterned mask layer to etch the etch stop layer, the spin-on material layer, and the first pattern layer.

2. The semiconductor device manufacturing method of claim 1, wherein the second mask layer is made of a material selected from SiON, SiN, Si, or SiO.

3. The semiconductor device manufacturing method of claim 1, further comprising:
   forming a second pattern layer in a second area on the substrate; and
   forming the spin-on material layer on the second pattern layer.

4. The semiconductor device manufacturing method of claim 3, wherein the forming the spin-on material layer on the second pattern layer further comprising:
   there is a gap between the spin-on material layer on the first pattern layer and the spin-on material layer on the second pattern layer.

5. The semiconductor device manufacturing method of claim 1, wherein the first pattern layer is made of a material including dielectric or metal.

6. The semiconductor device manufacturing method of claim 1, wherein the spin-on material layer is made of a material including organic polymer.

7. The semiconductor device manufacturing method of claim 1, wherein the etch stop layer is made of a material including SiO, SiON, or Si.

8. The semiconductor device manufacturing method of claim 1, wherein the first mask layer is made of a material including C.

9. The semiconductor device manufacturing method of claim 1, wherein the etch stop layer is harder than the first pattern layer and the spin-on material layer.

\* \* \* \* \*